United States Patent [19]
Lee et al.

[11] 3,983,479
[45] Sept. 28, 1976

[54] ELECTRICAL DEFECT MONITOR STRUCTURE

[75] Inventors: James H. Lee; Akella V. S. Satya, both of Wappingers Falls, N.Y.; Ashwin K. Ghatalia, Essex Junction; Donald R. Thomas, Westford, both of Vt.

[73] Assignee: International Business Machines Corporation, Armonk, N.Y.

[22] Filed: July 23, 1975

[21] Appl. No.: 598,480

[52] U.S. Cl. .............................. 324/158 R; 324/51
[51] Int. Cl.² ........................................ G01R 31/26
[58] Field of Search ........ 324/158 R, 158 D, 158 T, 324/51; 29/574

[56] References Cited
OTHER PUBLICATIONS
Ghatalia et al.; "Semiconductor Process Defect Monitor"; IBM Tech. Dis. Bull.; vol. 17; No. 9; Feb. 1975; pp. 2577–2578.

*Primary Examiner*—R. V. Rolinec
*Assistant Examiner*—Ernest F. Karlsen
*Attorney, Agent, or Firm*—Sughrue, Rothwell, Mion, Zinn and Macpeak

[57] ABSTRACT

A semiconductor defect monitoring structure employs a series of electrically testable serpentine stripe patterns having different widths and spacing in order to determine the distribution of the density of defects by size. Metal stripe patterns are superposed and rotated 90° with respect to diffusion stripe patterns in a semiconductor wafer. A set of four field effect transistor devices are connected to each stripe pattern in such a way that tests may be made for all defects without interference between adjacent patterns. The defect monitoring structure helps to determine defects such as opens in diffusion and metallization, shorts in metallization, shorts in diffusion, pinholes in a thin oxide, and pinholes in a thick oxide.

5 Claims, 13 Drawing Figures

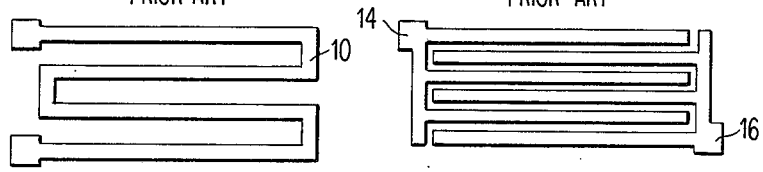
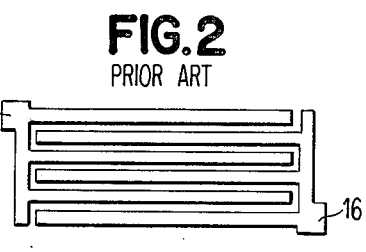
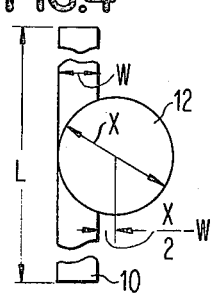
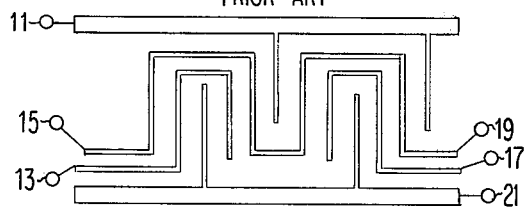
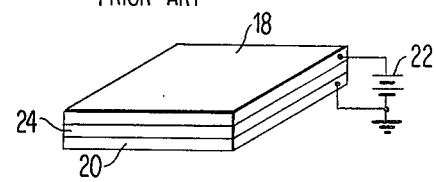
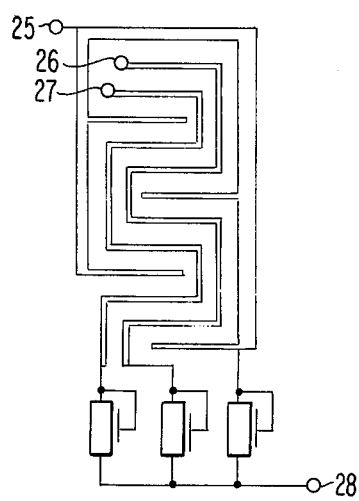
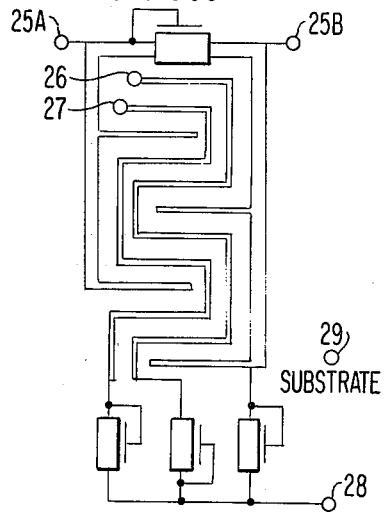
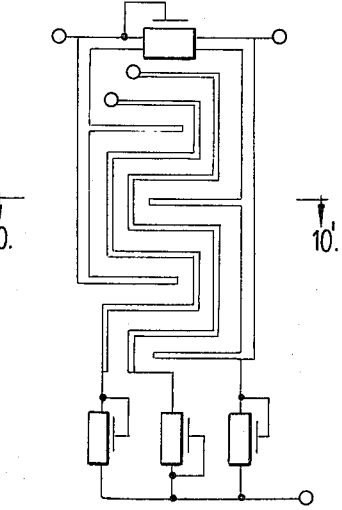
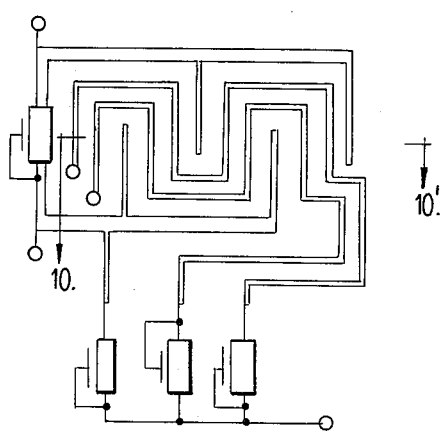

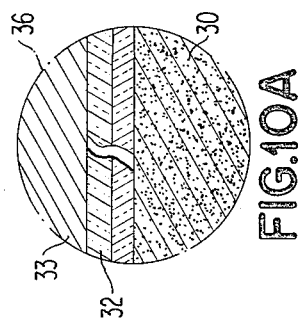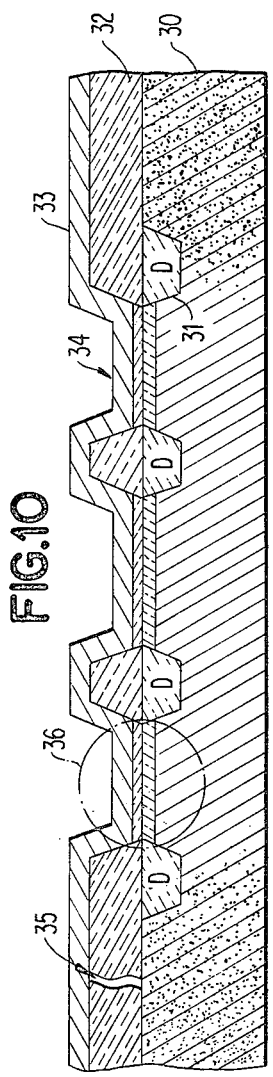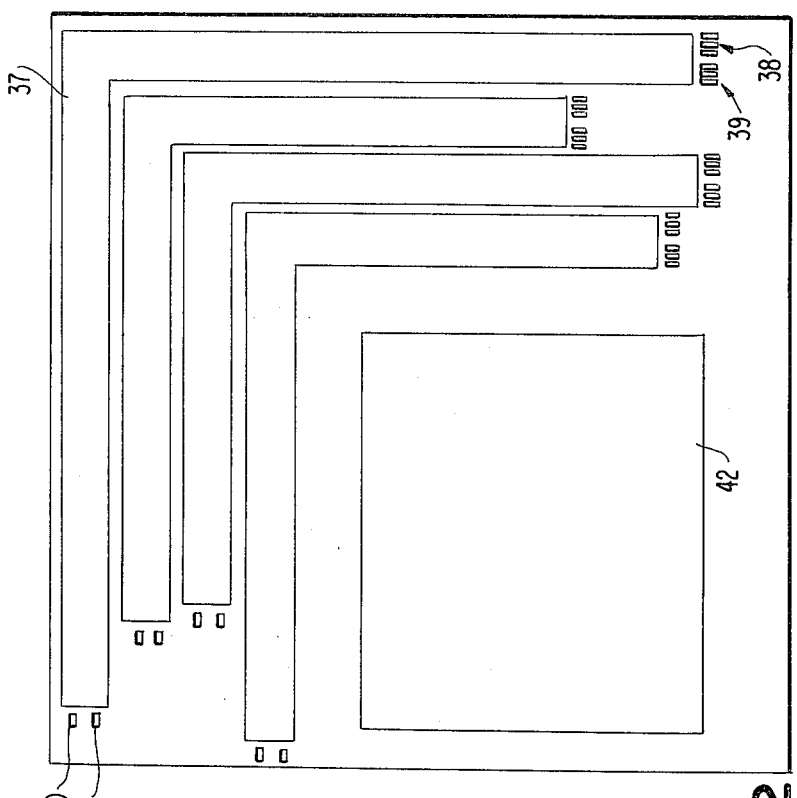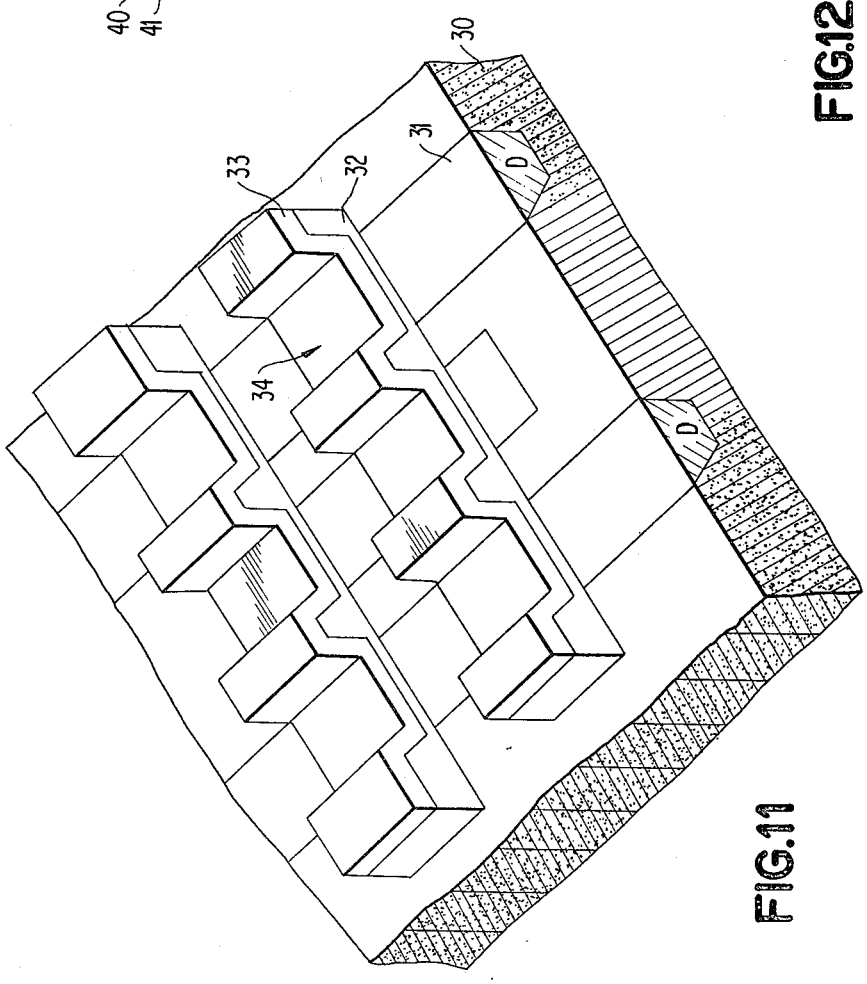

ELECTRICAL DEFECT MONITOR STRUCTURE

BACKGROUND OF THE INVENTION

1. Field of the Invention

The present invention generally relates to semiconductor defect monitors which enable defect distribution density to be determined for various sizes of defects, and more specifically, to a defect monitoring structure which permits testing for all defects in a semiconductor wafer without interference between adjacent patterns and different defect-monitoring tests.

2. Description of the Prior Art

In the development of integrated circuitry, and particularly large scale integrated circuits (LSI), design philosophy has become more concerned with the economics of total performance of the circuits rather than individual device parameters within the circuit. This is due in part to the fact that integrated circuits involve such a complicated pattern or interconnection of a multiplicity of components that the individual components cannot be readily isolated for testing purposes. In the past, special test sites have been formed at certain locations on the semi-conductor wafer, but the information afforded by various measurements made at these special test sites has been insufficient to predict the $t_0$-yield and reliability of the product integrated circuits formed concurrently with the test sites on the wafer.

SUMMARY OF THE INVENTION

It is therefore an object of the present invention to provide a semiconductor defect-monitoring structure which permits testing for all defects which may occur in the manufacture of semiconductor wafer.

The foregoing and other objects are attained by statistically designed and electrically testable monitors having different widths and spacings in order to determine the distribution of density of defects by size in a semiconductor wafer. The defect monitors are in the form of serpentine stripe patterns, and include both metal patterns and diffusion patterns superimposed but rotated 90° on the semiconductor wafer. Each striped pattern is provided with a set of four field effect transistors (FETs) connected such that the gates are flipped. This manner of connection permits testing for all defects in the semiconductor wafer without interference between adjacent patterns. In addition, less pads are needed. The result is a radically simplified test site for monitoring semiconductor processing lines to improve yield by failure detection.

BRIEF DESCRIPTION OF THE DRAWINGS

The specific nature of the invention, as well as other objects, aspects, uses and advantages thereof, will clearly appear from the following description and from the accompanying drawing, in which:

FIG. 1 illustrates a prior art continuity monitoring pattern;

FIG. 2 illustrates a prior art short circuit monitoring pattern;

FIG. 3 illustrates a prior art monitoring pattern for testing for both open and short circuits combining the features of the patterns of FIGS. 1 and 2;

FIG. 4 illustrates the geometry upon which the calculations of the probability of no defects occurring are based;

FIG. 5 illustrates a prior art monitoring structure to determine the pinhole-type defects in an insular layer between two conductive layers;

FIG. 6 is a circuit diagram of a basic defect monitoring structure employing three FETs and the monitoring pattern shown in FIG. 3;

FIG. 7 is a circuit diagram of a more sophisticated defect monitoring structure according to the present invention;

FIG. 8 is a circuit diagram of the metal circuit, and FIG. 9 is a circuit diagram of the diffusion circuit, the metal circuit being superimposed on the diffusion according to the present invention;

FIG. 10 is a cross-section of the integrated circuit taken along the section lines in FIGS. 8 and 9 and illustrates, among other things, a pinhole in a thick oxide;

FIG. 10A is an enlargement of a portion of the cross-sectional view of FIG. 10 illustrating a pinhole in a thin oxide and thin-nitride composite;

FIG. 11 is a 3-dimensional view of a portion of the defect monitor structure; and FIG. 12 is a planar view of an LSI illustrating a typical layout of defect monitoring structures according to the present invention.

DESCRIPTION OF THE PREFERRED EMBODIMENT

The semiconductor defect-monitors illustrated in FIGS. 1, 2 and 3 enable defect distribution density in a semiconductor wafer to be determined for various size defects. The resulting data is useful in determining in-process semiconductor yield levels. If a monitoring pattern 10, such as shown in FIG. 1, is provided on the surface of a semiconductor wafer using the same process steps as used by a product containing wafer, process induced defects experienced by the monitoring pattern will be the same as those experienced by the product. There is a certain probability that defects will occur such that the continuity of the line 10 will be broken. Defects which cause short circuits between two conductive regions, or lines, may be detected by the monitor shown in FIG. 2. In this case, a test for electrical shorts between contact pads 14 and 16 is made. The two patterns of FIGS. 1 and 2 may be combined as shown in FIG. 3 to permit both the continuity and short circuit testing. In this pattern, a plurality of serpentine lines weave about fingers projecting from two parallel buss-bars, and pads 11, 13, 15, 17, 19 and 21 are provided for the specific pattern illustrated in FIG. 3. In general, this type of pattern requires 2 + 2N pads where N is the number of serpentine stripe lines.

The following definition will aid in an understanding of the mathematical model upon which the defect monitors illustrated in FIGS. 1, 2 and 3 are based. A "defect" is any deviation from the design shape being fabricated as, for example, an extension, a notch, or the like. A "fault" is any defect which causes a loss of function such as opens or shorts. It will be understood that below a specific size, a defect cannot be a fault. The "critical area" is that area within which the center of a defect must fall to produce a fault. It will be assumed that the defect producing mechanisms act uniformly over the surface of the semiconductor wafer and with equal intensity on a wafer by wafer basis. With this assumption, it is possible to derive the Poisson probability density function to describe yield loss due to "random defects."

$$f(x) = \frac{\lambda^x e^{-\lambda}}{x!} \quad x = 0, 1, 2$$

$\lambda$ = the expected number of faults/chip
$x$ = the actual number of faults/chip But by our definition of "fault", it can be seen that we have "yield" or "good chips" only when $x = 0$. Thus, $$Y = e^{-\lambda}$$

By our definition of "defect" and "critical area", we see that the expected number of faults per chip ($\lambda$) is simply the product of defect density ($d$) and critical area (A). Therefore, $$Y = e^{-\lambda} = e^{-dA}$$

having arrived at this point, the next step is to determine the critical area. Referring now to FIG. 4, we first consider a pattern which is essentially a long, thin line of length $l$ and width $w$. The critical area for a defect of size $x$ is given by the following equation:

$$A(x) = l[w + 2(\frac{x}{2} - W)]$$
$$= l(x - w)$$

note that because the critical area for a defect of size $x$ is a function of $x$ it is necessary to determine the average critical area associated with defect sizes over the range that possibly can cause faults. A commonly accepted distribution of defects by size is $a/x^3$. By the definition of critical area and faults, we see that the diameter of the smallest defect which can cause the fault is $w$. Therefore integrating the function of $x$ which we will call $N(x)$ and defined as $a/x^3$, we get the following expression:

$$\int_w^\infty N(x)\, dx = \frac{a}{2w^2}$$

We can now define a function $g(x)$ as follows:

$$g(x) = \frac{2w^2}{x^3}$$

The average critical area for defects $\geq w$ is then given by the following expression:

$$\bar{A} = \int_w^\infty A(x) g(x)\, dx = lw$$

Therefore, we conclude that the average critical area for monitors of the "long thin type" can be given by $lw$. Therefore, when these monitors are tested for both continuity and shorts, "monitor yield" can be determined as follows:

$$G/N = Y = d^{-d\bar{A}} = e^{-d(lw)}$$

where $G$ = the number of good monitors,
$N$ = the total number of monitors,
$l$ = the length of the monitor, and
$w$ = the width of the monitor.

Solving the above equation for $d$, we arrive at the following express $$d = \frac{\ln Y}{lw}$$

where $d$ is the density of defects of size $\geq w$.

Having arrived at this expression, one can now determine the density of defects $\geq$ any size by invoking the $1/x^3$ assumption or, alternatively, a plurality of monitors can be provided on each integrated circuit chip to permit regression analysis to determine the relationship between defect density and defect size.

The defect monitors illustrated in FIGS. 1, 2 and 3 are designed to detect defects on the surface or in a planar layer of the semiconductor wafer. In order to determine the effect of defects between adjacent planar layers, a structure such as shown in FIG. 5 may be used. If a current is detected between conductive plates 18 and 20, when a potential is applied from, for example, battery 22, it can be assumed that a conductive defect has occured in separator plate 24. In this defect monitor, the size distribution is unimportant and also cannot be determined. Therefore, the monitor yield is given by the followng expression:

$$Y = e^{-A^* d}$$

where $A^*$ is the area of the monitor, and
$d$ is the average defect density.

FIG. 6 illustrates how the monitoring pattern in FIG. 3 can be modified to reduce the total number of test pads required. As shown in FIG. 6, the two parallel buss-bars are connected to form a single buss-bar having one test pad 25. The two serpentine stripe lines weaving around the fingers projecting from the buss-bar are provided with test pads 26 and 27 at one end thereof, and the other end of these stripe lines are connected to respective diode-mode FETs (e.g. gate shortened to drain as in FIG. 9). The buss-bar is also connected to a diode-mode FET, the source electrodes of the FETs being connected to a common test pad 28. This defect monitoring-circuit requires only N + 2 pads where N is the total number of serpentine stripe lines.

While the circuit in FIG. 6 is an improvement resulting in some simplicity of the defect monitor shown in FIG. 3, it is characterized in providing an ambiguity in measurement data analysis due to multiple types of defect incidents in the monitoring pattern. For example, in a continuity test of the serpentine stripe line connected to the test pad 27, an open in the line would be detected by applying a current to test pad 27 and failing to measure a lowered voltage between pads 27 and 28. However, if upstream from the open in the serpentine line there is also a short circuit to the serpentine stripe line having the test pad 26 or a short circuit to one of the fingers projecting from the buss-bar, then a test current applied to test pad 27 would result in the lowered voltage between pads 27 and 28 indicating no defects.

The present invention includes a modificaton of the defect monitor structure shown in FIG. 6, which retains the simplicity of requiring only N + 2 pads but eliminates the ambiquity in measurement data analysis due to multiple types of defect incidence in the monitor pattern. As shown in FIG. 7, the electrical defect monitor design according to the present invention uses four FET devices. In this design, the two buss-bars are shorted by the fourth diode-mode FET device and the direction of conduction of the other three FET devices relative to their neighbors are inverted. This design can be implemented in two possible ways, either with pad 25 at the A location or at the B location, whichever permits an optimum design layout. It wil be noted that FIG. 7 illustrates an additional test pad 29 which is connected to the substrate. This test pad permits the testing for defects between the defect monitor pattern and the substrate.

In the preferred embodiment of the invention, at least two defect monitoring structures of the type shown in FIG. 7 are employed in overlay layers of the semiconductor wafer. These are shown in FIGS. 8 and 9 and are identified as the metal circuit and the diffusion circuit, respectively. The metal circuit lies directly above the diffusion circuit, but the two circuits are rotated 90° with respect to one another and with an insulator in between.

FIGS. 10 and 11 illustrate the actual structure of the metal and diffusion circuits shown in FIGS. 8 and 9. The diffusion stripe pattern 31 is formed in the semiconductor substrate 30 by well-known means. An insulating oxide 32 is then formed over the surface of the substrate 30 and thereafter partially etched away between diffusion stripes 31. The metallized stripes 33 are then deposited over the oxide 32 perpendicular to the diffusion stripes 31. It will be recognized that this structure creates a matrix pattern of FET devices. This will be appreciated if, with reference to FIG. 10, two adjacent diffusion regions are considered as the source and the drain of the FET device and the cross-over at 34, for example, of metal and diffusion is the gate structure of the device. Thus, we may consider the superposed defect monitoring patterns of the metal circuit and the diffusion circuit as forming a "gate matrix". The stripes are made long enough and wide enough so that statistically a line will have no more than one open per line. Cross paths are made wide enough to intercept between 2000 to 90,000 gates of the matrix. In addition to helping to determine such semiconductor defects as opens and shorts in both diffusion and metallization, this structure permits the detection of pinholes in both a thick oxide and a thin oxide. A pinhole defect in a thick oxide is illustrated at 35 in FIG. 10. FIG. 10A is an enlarged view of the encircled area 36 in FIG. 10 and illustrates a pinhole in a thin oxide or the "gate matrix". Because of the defect monitor structure according to the present invention, all defects can be tested without interference between adjacent patterns because of the gate flip connection, that is, the conduction of each of the three FET devices connected to a common test pad is inverted with respect to its neighbors.

There are two ways in which the semiconductor defect monitor structure according to the invention can be employed. Either the defect monitoring structure can populate the entire wafer leaving no room for a product integrated circuit, or a few test sites may be placed on each product wafer. If the first alternative is adopted of completely populating a few wafers with the monitoring structure and intermixing these wafers with product wafers, then there is a problem of wafer to wafer variation. That is, data is gathered from some wafers, and this data is used to predict defects occurring in other wafers. On the other hand, if the alternative of placing a few test sites on each product wafer is adopted, then the amount of area per wafer devoted to monitors is greatly reduced thereby reducing the ability to obtain a high correlation on a wafer by wafer basis.

While both alternatives will encounter some difficulty in trying to predict defects on a wafer by wafer basis, either alternative is viable in predicting "average yields." The defect-monitor test site is illustrated in FIG. 12. Here, a plurality, four in number, of monitors 37 are provided in each test site. It will be understood that the monitors 37, while having the same general pattern, are not identical but vary in line length and width to permit the use of regression formulae for determining defect size distribution. Associated with each monitor 37 are the three FET devices 38 for the metal circuit, which are connected to a common terminal and the three FET devices 39 of the diffusion circuit which are connected to a common pad. At the opposite end of the test site are the fourth FET devices 40 and 41 for the metal and diffusion circuits, respectively. A portion of the test chip area is reserved as a product integrated circuit site 42, in order to verify the predicted yields.

It will be apparent that the embodiment shown is only exemplary and that various modifications can be made in construction and arrangement within the scope of the invention as defined in the appended claims. For example, in the preferred embodiment, FET technology is considered, but the principles of the invention can be extended to other technologies with diodes or other gating devices taking the place of the FETs.

We claim:

1. An electrical defect-monitor structure for semiconductor wafers comprising:
   a plurality of coextending serpentine first diffusions,
   two-spaced coextending second diffusions sandwiching said first diffusions therebetween and having lateral extensions extending into the valleys of said first diffusions,
   first gating means shorting said second diffusions at adjacent ends thereof,
   first gating means in each of said first diffusions and one of said second diffusions at common ends thereof, all of said gating means being connected in common,
   test contact pads adjacent each distal end of said first diffusions, one of said diffusions and the common connection of said first gating means,
   an insulating layer over said first and second diffusions,
   a plurality of serpentine first metal conductor lines on said insulating layer and extending transversely to said plurality of first diffusions,
   two spaced second metal conductor lines sandwiching said first metal conductor lines therebetween and having lateral extensions extending into the valleys of said first metal conductor lines,
   means shorting said second metal conductor lines at adjacent ends thereof,
   second gating means connected to each said first metal conductor lines at common ends thereof and one of said second metal conductor lines, all of said second gating means being connected in common, and
   second test contact pads, adjacent each distal end of said first metal conductor lines, one of said second metal conductor lines and the common connection of said fourth gating means.

2. An electrical defect monitor structure as recited in claim 1 wherein said means shorting said second diffusions is a third gating means and said means shorting said second metal conductor lines is a fourth gating means.

3. An electrical defect monitor structure as recited in claim 2 wherein each of said first, second, third and fourth gating means are diffused gating means.

4. An electrical defect monitor structure as recited in claim 3 wherein each of said diffused gating means are diode-mode field effect transistor devices.

5. An electrical defect monitor structure as recited in claim 4 wherein said first gating means are alternately reversed in polarity and said second gating means are alternately reversed in polarity.

* * * * *

UNITED STATES PATENT AND TRADEMARK OFFICE
CERTIFICATE OF CORRECTION

PATENT NO. : 3,983,479
DATED : September 28, 1976
INVENTOR(S) : James H. Lee et al It is certified that error appears in the above-identified patent and that said Letters Patent are hereby corrected as shown below:

IN THE SPECIFICATION:
Col. 1, line 38, after "testable" insert --defect--
line 49, after "less" insert --test--

Col. 3, line 1, delete entire equation and insert the following:

$$-- f(x) = \frac{\lambda^x e^{-\lambda}}{x!} \qquad x = 0, 1, 2 \ldots --$$

line 26 & 28, delete the equation on both lines in their entirety and insert the following:

$$-- A(x) = \ell[w + 2(\frac{x}{2} - w)]$$
$$= \ell(x-w) --$$

line 68, delete "express" insert --expression--

Col. 6, line 42 after "said" insert --second--

Signed and Sealed this

Twenty-second Day of February 1977

[SEAL]

Attest:

RUTH C. MASON
*Attesting Officer*

C. MARSHALL DANN
*Commissioner of Patents and Trademarks*